(12) United States Patent
Ng et al.

(10) Patent No.: US 7,786,781 B1
(45) Date of Patent: Aug. 31, 2010

(54) PSEUDO-RANDOM PULSE WIDTH MODULATION FOR HIGH RESOLUTION FAN CONTROL

(75) Inventors: Chungwai Benedict Ng, San Francisco, CA (US); Eric Tam, San Jose, CA (US); Eugene Quan, Fremont, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 117 days.

(21) Appl. No.: 12/021,907

(22) Filed: Jan. 29, 2008

(51) Int. Cl.
*H03K 3/017* (2006.01)
*H03K 5/04* (2006.01)
*H03K 7/08* (2006.01)

(52) U.S. Cl. .................. 327/175; 327/172; 327/173; 327/174; 327/176; 327/177

(58) Field of Classification Search .......... 327/172–177
See application file for complete search history.

(56) References Cited

U.S. PATENT DOCUMENTS

| | | | |
|---|---|---|---|
| 7,426,583 B1 * | 9/2008 | Dutra et al. ............. | 710/3 |
| 2005/0212576 A1 * | 9/2005 | Shinohara ............ | 327/172 |

* cited by examiner

*Primary Examiner*—Lincoln Donovan
*Assistant Examiner*—John W Poos

(57) ABSTRACT

A pulse width modulation (PWM) device, system and method for high resolution fan control are disclosed. In one embodiment, the method comprises determining a target duty cycle of a PWM signal, determining the number of PWM cycles in the period of the PWM signal, pseudo-randomly selecting a duty cycle for each PWM cycle using one or more look-up tables and generating the PWM signal based on the duty cycle.

19 Claims, 9 Drawing Sheets

200

| PWM CYCLE | CUR PWM | CUR ERR | ACC ERR | NEXT PWM |
|---|---|---|---|---|
| 1 | 8 | -.0625 | -.0625 | 9 |
| 2 | 9 | .9375 | .8750 | 8 |
| 3 | 8 | -.0625 | .8125 | 8 |
| 4 | 8 | -.0625 | .7500 | 8 |
| 5 | 8 | -.0625 | .6875 | 8 |
| 6 | 8 | -.0625 | .6250 | 8 |
| 7 | 8 | -.0625 | .5625 | 8 |
| 8 | 8 | -.0625 | .5000 | 8 |
| 9 | 8 | -.0625 | .4375 | 8 |
| 10 | 8 | -.0625 | .3750 | 8 |
| 11 | 8 | -.0625 | .3125 | 8 |
| 12 | 8 | -.0625 | .2500 | 8 |
| 13 | 8 | -.0625 | .1875 | 8 |
| 14 | 8 | -.0625 | .1250 | 8 |
| 15 | 8 | -.0625 | .0625 | 8 |
| 16 | 8 | -.0625 | 0 | 8 |
| 17 | 8 | -.0625 | -.0625 | 9 |
| 18 | 9 | .9375 | .8750 | 8 |
| 19 | 8 | -.0625 | .8125 | 8 |
| 20 | 8 | -.0625 | .7500 | 8 |
| 21 | 8 | -.0625 | .6875 | 8 |
| 22 | 8 | -.0625 | .6250 | 8 |
| 23 | 8 | -.0625 | .5625 | 8 |
| 24 | 8 | -.0625 | .5000 | 8 |
| 25 | 8 | -.0625 | .4375 | 8 |
| 26 | 8 | -.0625 | .3750 | 8 |
| 27 | 8 | -.0625 | .3125 | 8 |
| 28 | 8 | -.0625 | .2500 | 8 |
| 29 | 8 | -.0625 | .1875 | 8 |
| 30 | 8 | -.0625 | .1250 | 8 |
| 31 | 8 | -.0625 | .0625 | 8 |
| 32 | 8 | -.0625 | 0 | 8 |

| PWM CYCLE | 8 CLOCK CYCLES TO ADD | 4 CLOCK CYCLES TO ADD | 2 CLOCK CYCLES TO ADD | 1 CLOCK CYCLE TO ADD |
|---|---|---|---|---|
| 1 | 1 | | | |
| 2 | | 1 | | |
| 3 | 1 | | | |
| 4 | | | | 1 |
| 5 | 1 | | | |
| 6 | | 1 | | |
| 7 | 1 | | | |
| 8 | | | 1 | |
| 9 | 1 | | | |
| 10 | | 1 | | |
| 11 | 1 | | | |
| 12 | | | | |
| 13 | 1 | | | |
| 14 | | 1 | | |
| 15 | 1 | | | |
| 16 | | | 1 | |

FIGURE 4A

| PWM CYCLE | 8 CLOCK CYCLES TO ADD | 4 CLOCK CYCLES TO ADD | 2 CLOCK CYCLES TO ADD | 1 CLOCK CYCLE TO ADD |
|---|---|---|---|---|
| 1 | | | 1 | |
| 2 | 1 | | | |
| 3 | | 1 | | |
| 4 | 1 | | | |
| 5 | | | | |
| 6 | 1 | | | |
| 7 | | 1 | | |
| 8 | 1 | | | |
| 9 | | | | |
| 10 | 1 | | 1 | |
| 11 | | 1 | | |
| 12 | 1 | | | |
| 13 | | | | 1 |
| 14 | 1 | | | |
| 15 | | 1 | | |
| 16 | 1 | | | |

FIGURE 4B

| PWM CYCLE | 8 CLOCK CYCLES TO ADD | 4 CLOCK CYCLES TO ADD | 2 CLOCK CYCLES TO ADD | 1 CLOCK CYCLE TO ADD |
|---|---|---|---|---|
| 1 | 1 | | | |
| 2 | 1 | | | |
| 3 | | 1 | | |
| 4 | | 1 | | |
| 5 | 1 | | | |
| 6 | 1 | | | |
| 7 | | | | 1 |
| 8 | | | | |
| 9 | 1 | | | |
| 10 | 1 | | | |
| 11 | | | 1 | |
| 12 | | | 1 | |
| 13 | 1 | | | |
| 14 | 1 | | | |
| 15 | | 1 | | |
| 16 | | 1 | | |

FIGURE 4C

| PWM CYCLE | 8 CLOCK CYCLES TO ADD | 4 CLOCK CYCLES TO ADD | 2 CLOCK CYCLES TO ADD | 1 CLOCK CYCLE TO ADD |
|---|---|---|---|---|
| 1 | | 1 | | |
| 2 | | 1 | | |
| 3 | 1 | | | |
| 4 | 1 | | | |
| 5 | | | 1 | |
| 6 | | | 1 | |
| 7 | 1 | | | |
| 8 | 1 | | | |
| 9 | | | | |
| 10 | | | | 1 |
| 11 | 1 | | | |
| 12 | 1 | | | |
| 13 | | 1 | | |
| 14 | | 1 | | |
| 15 | 1 | | | |
| 16 | 1 | | | |

FIGURE 4D

PSEUDO-RANDOM PULSE WIDTH MODULATION FOR HIGH RESOLUTION FAN CONTROL

FIELD OF TECHNOLOGY

This disclosure relates generally to a pulse width modulation for high resolution fan control.

BACKGROUND

Pulse width modulation of a signal or power source involves the modulation of its duty cycle to either convey information over a communications channel or control the amount of power sent to a load. To obtain high resolution in the duty cycle and more efficient power consumption for the load, typical solutions require a high resolution and high frequency PWM signal with a low input clock frequency.

U.S. Pat. No. 6,765,422 (e.g., Aslan et al.) describes the basic technology and is all herein incorporated by reference in their entirety for all purposes. More particularly, FIG. 1 illustrates a block diagram for obtaining a finer resolution using an error integrating loop 100. For example, the error integrating loop 100 may be used to achieve a target PWM duty cycle of 50.39% which is equal to 8.0625/16 using a 360 KHz clock. This would result in the frequency of PWM signal at 22.5 KHz, i.e., 360 KHz/16 clock cycles per single PWM cycle.

To achieve the target PWM duty cycle of 50.39%, 8 clock cycles long PWM pulse signals and a 9 clock cycle long PWM pulse signal are selectively generated for a PWM period. In FIG. 1, a current PWM signal 104 is subtracted by the target PWM pulse clock cycles 102, i.e., 8.0625, to generate a current error 106. The current error 106 is added to an accumulated error 108 to generate the next stage of the accumulated error 108. The accumulated error 108 is then compared with a reference value (e.g., zero) using a comparator 112. If the accumulated error 108 is greater than or equal to zero, the comparator 112 generates a signal 114 which triggers a two-to-one MUX 116 to select an 8 clock cycle long pulse signal 118 as the current PWM signal 104. If the accumulated error 108 is less than zero, a 9 clock cycle long pulse signal 120 is selected as the current PWM signal 104. In addition, the current PWM signal 104 may be forwarded to a load 122, such as a fan control device.

FIG. 2A is a table 200 illustrating 32 PWM cycles of the error integrating loop 100 of FIG. 1. As illustrated in FIG. 2A, each of the $2^{nd}$ PWM cycle and the $18^{th}$ PWM cycle is a 9 clock cycle long pulse, whereas each of the remaining PWM cycles is an 8 clock cycle long pulse. Moreover, the period of the PWM signal is 16 PWM cycles, and its duty cycle is $\{(8*15)+9\}/16*16=50.39\%$. Although the error integrating loop 100 generates the PWM signal which achieves the target PWM duty cycle, the fixed location of the 9 clock cycle long pulse within the PWM period as illustrated in FIG. 2B may create noise audible to human ears, thus impeding the efforts of realizing a silent fan control.

SUMMARY

This summary is provided to introduce a selection of concepts in a simplified form that are further described below in the detailed description. This summary is not intended to identify key features or essential features of the claimed subject matter, nor is it intended to be used to limit the scope of the claimed subject matter.

An embodiment described in the detailed description is directed to a pulse width modulation device, system and method for high resolution fan control. In one embodiment, the method comprises determining a target duty cycle of a PWM signal, determining the number of PWM cycles in the period of the PWM signal, pseudo-randomly selecting a duty cycle for every PWM cycle using one of several look-up tables and generating the PWM signal.

Another embodiment described in the detailed description is directed to a system comprising a first PWM circuit generating a stream of a first PWM signal having an n clock cycle long pulse, a second PWM circuit generating a second PWM signal having an n+a clock cycle long pulse and a PWM signal selection circuit pseudo-randomly selecting between the first PWM signal and the second PWM signal based on a target PWM duty cycle, where n and a are positive integers.

Yet another embodiment described in the detailed description is directed to an apparatus comprising one or more multiplexers with each multiplexer generating a candidate signal by selecting between a first PWM signal having an n clock cycles long pulse and a second PWM signal having an n+a clock cycle long pulse based on a first selection signal, one or more look-up table generation logics with each look-up table generation logic generating the first selection signal and an n-to-one multiplexer pseudo-randomly selecting the candidate signal of one of the multiplexers to generate an output signal, where n and a are positive integers.

As illustrated in the detailed description, other embodiments pertain to devices, methods and systems for high resolution fan control based on the pseudo-random pulse width modulation, and in particular, reduction or elimination of noise caused by the conventional PWM signal generator recited in U.S. Pat. No. 6,765,422 (e.g., Aslan et al.). By using the pseudo-random PWM, the embodiments significantly reduce or eliminate such noise.

BRIEF DESCRIPTION OF THE DRAWINGS

Example embodiments are illustrated by way of example and not limitation in the figures of the accompanying drawings, in which like references indicate similar elements and in which:

FIG. 2A is a table illustrating 32 PWM cycles of the error integrating loop of FIG. 1.

FIGS. 4A through 4D illustrate exemplary look-up tables, according to one embodiment.

Other features of the present embodiments will be apparent from the accompanying drawings and from the detailed description that follows.

DETAILED DESCRIPTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the claims. Furthermore, in the detailed description, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

Briefly stated, embodiments significantly reduce or eliminate noise produced by the repetition of one or more PWM pulses adjusted to obtain a high resolution target duty cycle across a PWM signal stream. More particularly, the embodiments use a pseudo-random PWM to reduce or eliminate the noise.

Figure 1:
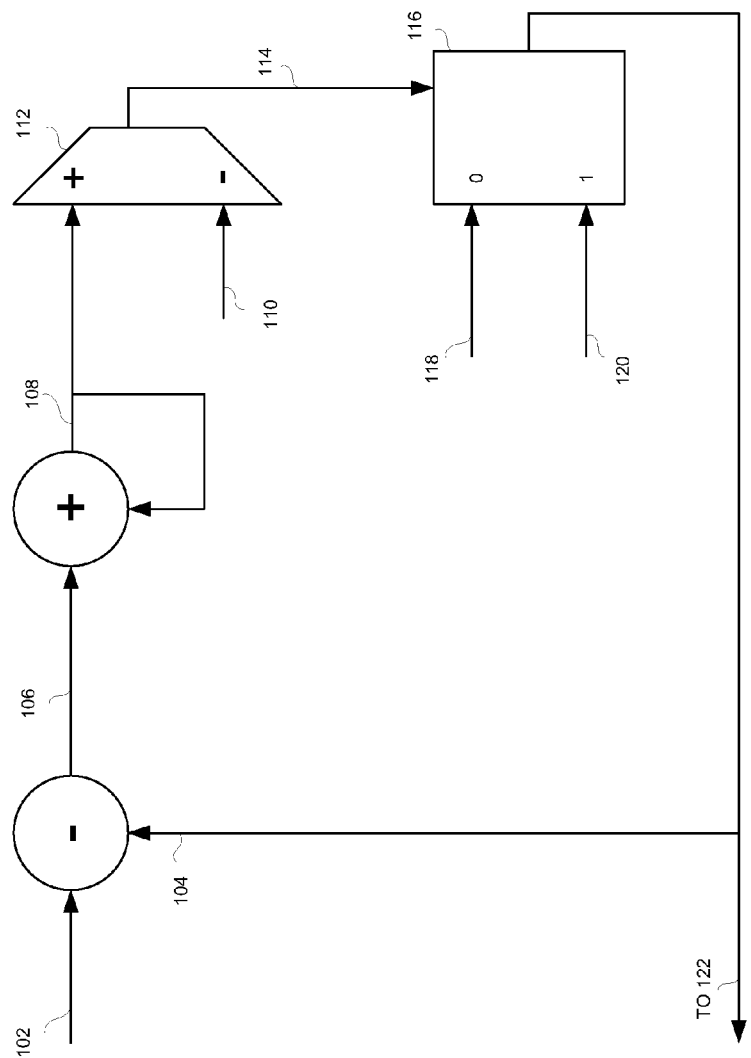
FIG. 1 illustrates a block diagram for obtaining a finer resolution using an error integrating loop.
Figure 2B:
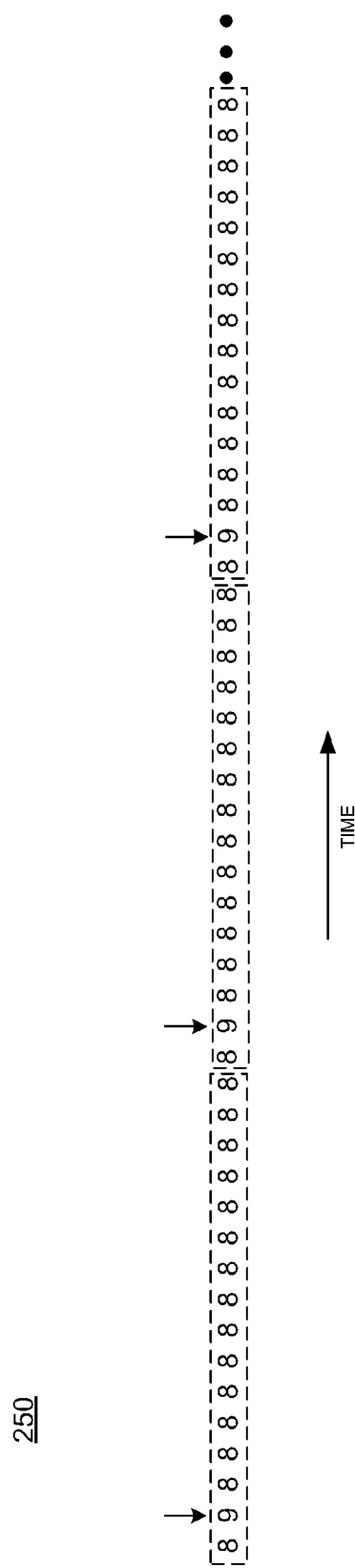
FIG. 2B is a PWM signal generated by the error integrating loop of FIG. 1.
Figure 3:
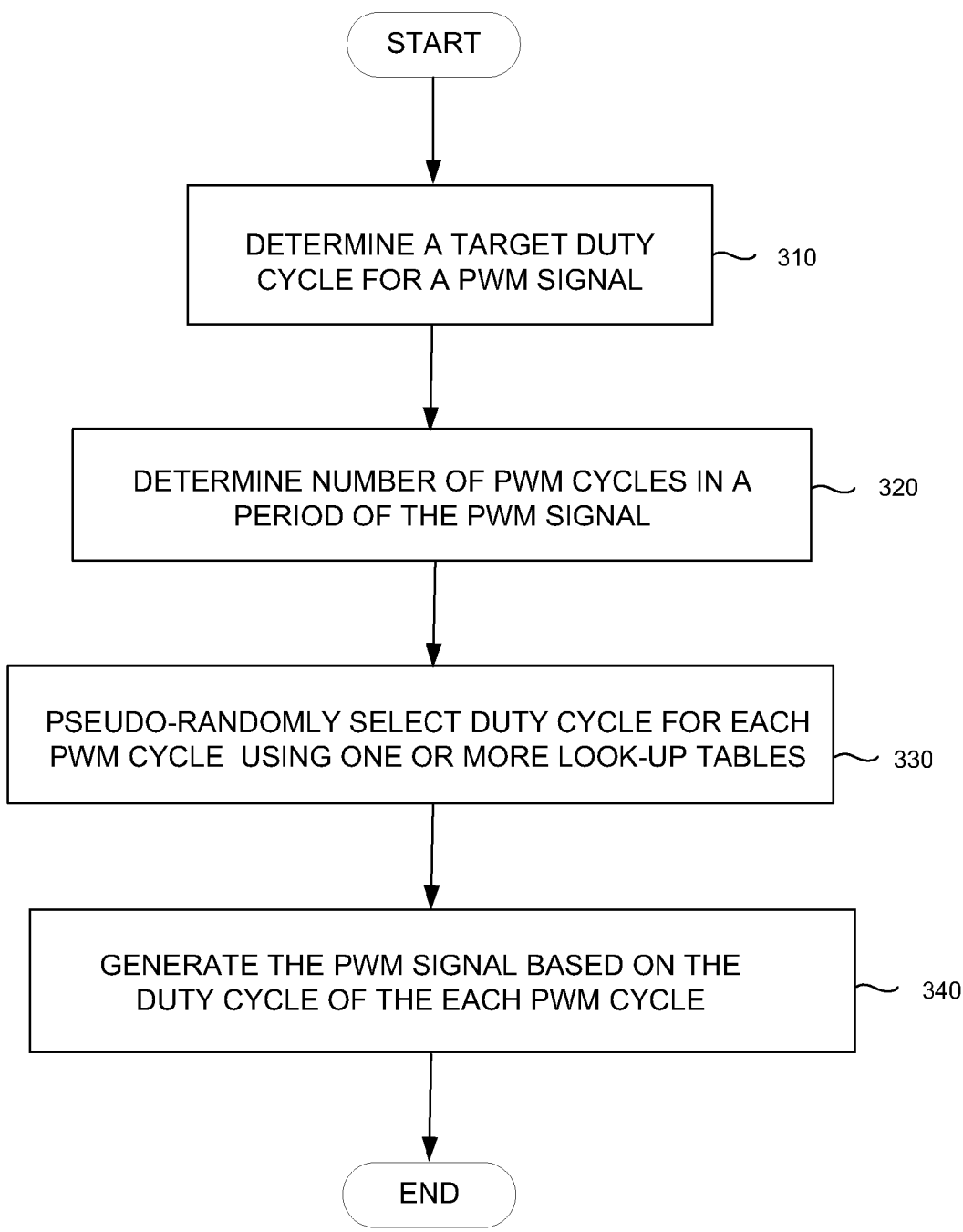
FIG. 3 is an exemplary process flow chart for generating a high resolution PWM signal at low noise level, according to one embodiment.

FIG. 3 is an exemplary process flow chart 300 for generating a high resolution PWM signal at low noise level, according to one embodiment. In operation 310, a target duty cycle for a PWM signal is determined. For example, the target duty cycle is set at 8.0625/16, which is an 8.0625 clock cycle long pulse signal, or 129/256, which is 129 clock cycles in the PWM period of 256 clock cycles. In operation 320, the number of PWM cycles in the PWM period is determined. In this case, 16 PWM cycles are present in the PWM period.

In operation 330, the duty cycle for every PWM cycle is pseudo-randomly selected using one of several look-up tables available. It is appreciated that each of the look-up tables is different from the remaining look-up tables. Since the duty cycles for the PWM cycles in the PWM period are determined based on a pseudo-randomly selected look-up table, the duty cycles for the PWM cycles are not fixed across a PWM signal comprising numerous PWM periods. In operation 340, the PWM signal is generated based on the duty cycles assigned for the PWM cycles.

In one exemplary embodiment, the look-up tables may be used to assign a pulse-width of every PWM cycle. In addition, the look-up tables indicate a number of clock cycles present in each one of the PWM cycles. The look-up tables are interpreted based on a number of clock cycles being added to pulses present in the period of the PWM signal to obtain the target duty cycle. Some of the look-up tables may be constructed by mirroring respective number of look-up tables which have already been constructed.

It is appreciated that the PWM signal based on the 16 PWM cycle period has a higher resolution than a PWM signal based on a single PWM cycle period (e.g., which is 1/256 versus 1/16). The resolution can be increased even more by expanding the period of the PWM signal. In addition, it is appreciated that noise due to the fixed location or locations of one or more PWM pulses with an additional clock cycle may be eliminated by pseudo-randomly assigning the location or locations using the multiple look-up tables.

FIGS. 4A through 4D illustrate exemplary look-up tables 400, according to one embodiment. In the figures, the first column indicates the order of PWM cycles in a particular PWM period. In one exemplary embodiment, the look-up tables are used to assign the pulse-width of the PWM cycles. That is, the look-up tables indicate which PWM cycle or PWM cycles present in the PWM period are assigned with a pulse having one more clock cycle than the rest. Given the number of clock cycles to add to a pulse or pulses present in the PWM period to obtain the target duty cycle for the PWM period, the location(s) of the pulse or pulses with the extra clock cycles are randomly pre-assigned using the look-up tables.

For example, in FIG. 4A, if 1 clock cycle is added to a pulse of the PWM period to increase the duty cycle by 0.39% (1/256), the clock cycle is pre-assigned to the $4^{th}$ PWM cycle. If 2 clock cycles are added to two individual pulses present in the PWM period to increase the duty cycle by 0.78%, each of the two clock cycles is pre-assigned to the $8^{th}$ PWM cycle and the $16^{th}$ PWM cycle, respectively. If 3 clock cycles are added to three individual pulses of the PWM period to increase the duty cycle by 1.17%, each of the three clock cycles is pre-assigned to the $4^{th}$ PWM cycle, the $8^{th}$ PWM cycle and the $16^{th}$ PWM cycle, respectively.

It is appreciated that up to 15 clock cycles (e.g., the number of PWM cycles in the PWM period −1) may be added to the PWM period based on the look-up tables. It is also appreciated that more or less than 15 clock cycles may be added to one or more pulses present in the PWM period, and this may require a new set of look-up tables.

In one exemplary embodiment, the PWM period may be expanded to increase a resolution of a duty cycle for the PWM period. For example, if 32 PWM cycles are used instead of 16 PWM cycles for the PWM period, the resolution of the PWM period is doubled. Furthermore, one or more of the look-up tables may be obtained by mirroring their counterpart look-up tables. For example, the look-up table illustrated in FIG. 4B is generated by mirroring the look-up table illustrated in FIG. 4A along x-axis, whereas the look-up table illustrated in FIG. 4D is generated by mirroring the look-up table illustrated in FIG. 4C along x-axis. It is appreciated that each of the look-up tables is unique.

Figure 5:
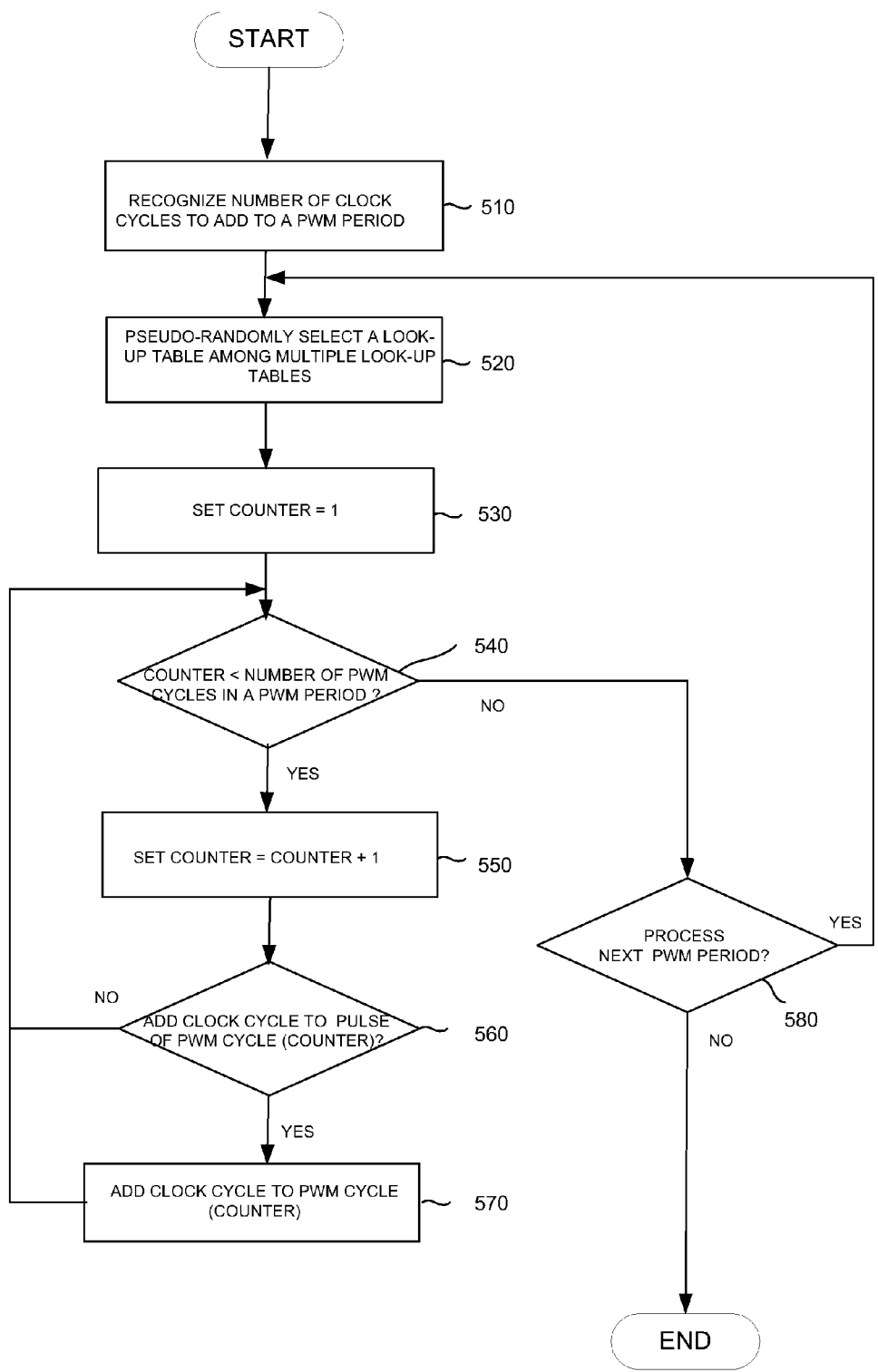
FIG. 5 is an exemplary flow chart for pseudo-randomly selecting a duty cycle for each PWM cycle using multiple look-up tables, according to one embodiment.

FIG. 5 is an exemplary flow chart 500 for pseudo-randomly selecting a duty cycle for each PWM cycle using multiple look-up tables, according to one embodiment. In operation 510, the number of clock cycles to add to a PWM period to reach a target duty cycle is recognized. For example, 1 clock cycle needs to be added to any one of the pulses present in the PWM period to reach the target duty cycle of 50.39%, where there are 16 clock cycles in a PWM cycle and 16 PWM cycles in the PWM period.

In operation 520, a look-up table is pseudo-randomly selected. For example, the look-up table of FIG. 4B is selected using a pseudo-random selection device. Then, in operation 530, a counter is set to be 1. In operation 540, the counter is compared to the number of PWM cycles in the PWM period, which is 16 in this case. If it is less than 16, then the counter is increased by 1 in operation 550. In operation 560, whether there is a clock cycle to add to the particular PWM cycle is determined based on the look-up table. In FIG. 4B, only the $13^{th}$ PWM cycle has an additional clock cycle added to its pulse. Accordingly, for the PWM cycle, a single clock cycle is added to the pulse in operation 570. Then, it runs up the counter, and the process described in operations 520 through 570 are repeated for next PWM period with another pseudo-randomly selected look-up table, as illustrated in operation 580.

Figure 6:
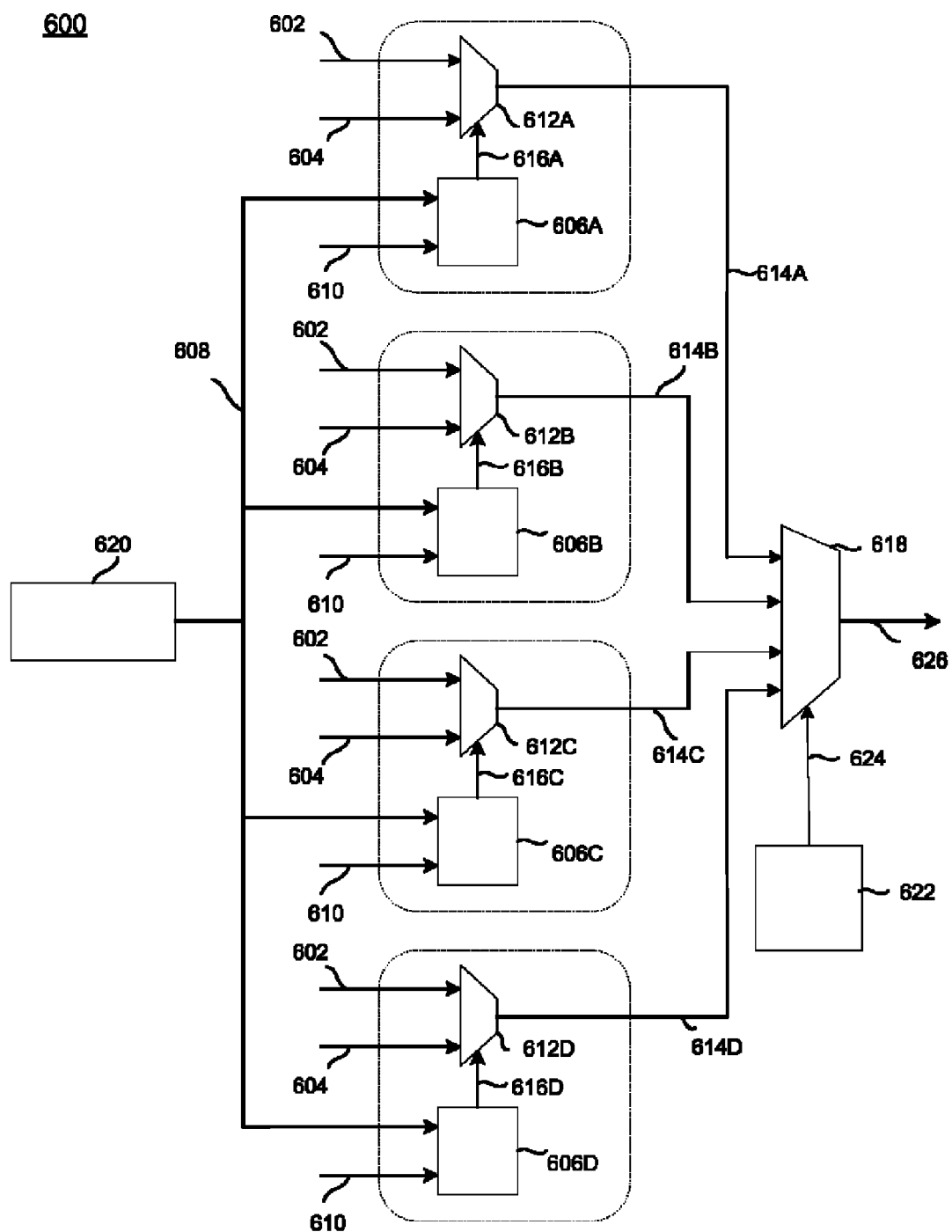
FIG. 6 is an exemplary block diagram for generating a high resolution, low noise PWM signal by pseudo-randomly selecting one of multiple look-up tables, according to one embodiment.

FIG. 6 is an exemplary block diagram 600 for generating a high resolution, low noise PWM signal by pseudo-randomly selecting one of multiple look-up tables, according to one embodiment. In one exemplary embodiment, a system for high resolution low noise fan control comprises a first PWM circuit (e.g., which is not shown in the figure) generating a first PWM signal 602 having an n clock cycle long pulse, a second PWM circuit (e.g., which is not shown in the figure) generating a second PWM signal 604 having an n+a clock cycle long pulse, where both n and a are positive integers. For example, the first PWM circuit may generate a pulse with its width equal to 8 clock cycles, whereas the second PWM circuit may generate a pulse with its width equal to 9, 10, 11, 12, 13, 14 or 15 clock cycles.

The system further comprises a PWM signal selection circuit pseudo-randomly selecting between the first PWM signal 602 and the second PWM signal 604 based on a target PWM duty cycle, where the first PWM signal 602 and the second PWM signal 604 are one PWM cycle long, and where the pseudo-randomly selecting is performed using multiple look-up table logic circuits (e.g., 606A, 606B, 606C and 606D) based on a number of PWM cycles present in a PWM period 608 and a number of clock cycles to add to pulses present in the PWM period 610.

In one exemplary embodiment, the PWM signal selection circuit is built with several two-to-one multiplexers (e.g., 612A, 612B, 612C and 612D) with each multiplexer generating a candidate signal (e.g., 614A, 614B, 614C and 614D) by selecting between the first PWM signal 602 and the second PWM signal 604 based on a first selection signal (e.g., 616A, 616B, 616C and 616D). It is appreciated that the two-to-one multiplexers can be replaced with n-to-1 multiplexers for another exemplary implementation. Thus, the PWM signal selection circuit pseudo-randomly selects one among multiple PWM signals having different pulse widths (e.g., 8 clock cycles, 9 clock cycles, 10 clock cycles, 11 clock cycles and etc.) based on the selection signal.

The PWM signal selection circuit further comprises one or more look-up table generation logics (e.g., 606A, 606B, 606C and 606D) with each look-up table generation logic generating the first selection signal and an n-to-one multiplexer 618 pseudo-randomly selecting the candidate signal of one of the two-to-one multiplexers to generate an output signal 626. Moreover, the PWM signal selection circuit further comprises a counter module 620 coupled to the look-up generation table logics generating the order of the PWM cycles in the PWM period 608.

Furthermore, the PWM signal selection circuit further comprises a pseudo-random selection module 622 coupled to the n-to-1 multiplexer 618 generating a signal 624 which enables the n-to-1 multiplexer to select among the candidate signals to generate the output signal 626.

In one exemplary embodiment, each of the look-up table generation logics uniquely places one or more clock cycles to one or more pulses present in the PWM period. In one exemplary embodiment, the system first pseudo-randomly selects one of the look-up table generation logics used to add an extra clock cycle to one or more pulses present in the PWM period.

Because of the pseudo-random selection carried out by the system, locations of the pulse or pulses with an extra clock cycle (e.g., the second PWM signal 604) are not fixed across PWM periods, thus reducing or eliminating noise due to the fixed location or locations of the pulse or pulses across the PWM periods. Furthermore, the first selection signal (e.g., 616A, 616B, 616C and 616D) is determined based on the order of the PWM cycles in the PWM period 608 and the number of clock cycles to add to pulses present in the PWM period 610.

In an alternative exemplary embodiment, an apparatus for pseudo-random pulse width modulation comprises one or more multiplexers (e.g., 612A, 612B, 612C and 612D) with each multiplexer generating the candidate signal (e.g., 614A, 614B, 614C and 614D) by selecting between the first PWM signal 602 having an n clock cycles long pulse and the second PWM signal 604 having an n+a clock cycles long pulse based on the first selection signal (e.g., 616A, 616B, 616C and 616D). The apparatus also includes one or more look-up table generation logics (e.g., 606A, 606B, 606C and 606D), with each look-up table generation logic generating the first selection signal.

Moreover, the apparatus includes the n-to-one multiplexer 618 pseudo-randomly selecting the candidate signal of one of the multiplexers to generate the output 626. A duty cycle of the output signal is n/(total clock cycles in a single cycle of the first PWM signal) or (n+a)/(total clock cycles in the single cycle of the first PWM signal). For example, if the first PWM signal 602 is selected as the output signal, the duty cycle for the output signal is 50%. On the other hand, the duty cycle for the output signal becomes 50.625% if the second PWM signal 604 is selected as the output signal.

In one exemplary embodiment, the apparatus comprises a pseudo-random selection module 622 coupled to the n-to-1 multiplexer 618 generating a signal 624 which enables the n-to-1 multiplexer 618 to select and forward the candidate signal to generate the output signal 626.

Figure 7:
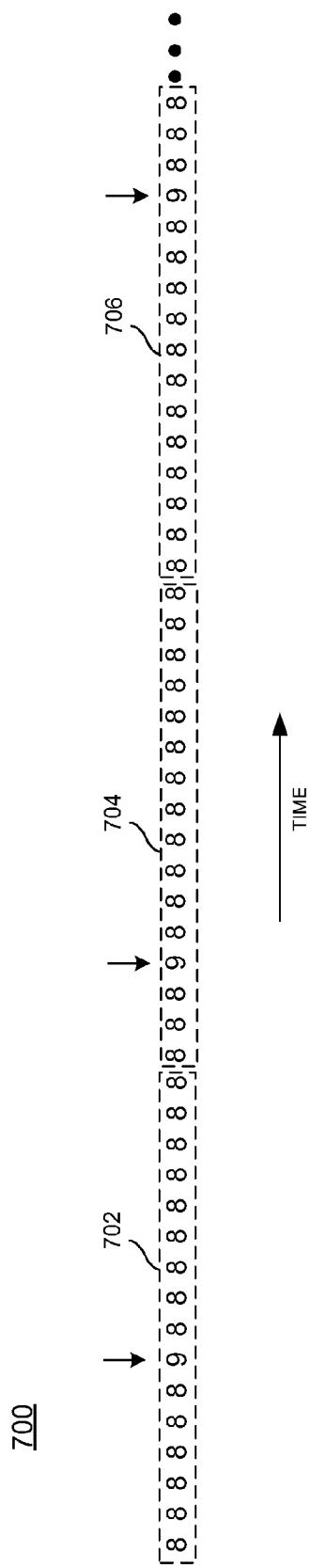
FIG. 7 is an exemplary high resolution, low noise PWM signal, according to one embodiment.

FIG. 7 is an exemplary high resolution, low noise PWM signal 700, according to one embodiment. As illustrated in FIG. 7, the location of a pulse with an extra clock cycle is not fixed across PWM periods. For example, in a period 702, the pulse with 9 clock cycles is in the $7^{th}$ place. For a period 704 and a period 706, the pulse is located in the $4^{th}$ place and $13^{th}$ place, respectively. Thus, the random nature of placing the extra clock cycle to a pulse or pulses across periods of a PWM signal enables the present invention to reduce or eliminate noise audible to human ears due to the repetition of the pulses which can ensue without the benefit of the present invention.

In summary, embodiments described herein pertain to methods, systems and devices which reduce or eliminate noise produced when one or more PWM pulses that are adjusted to obtain a high resolution target duty cycle are placed at fixed location or locations within the PWM period of a PWM signal stream. To reduce or eliminate the noise, the embodiments pseudo-randomly place the pulse or pulses within each PWM period.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A pseudo-random pulse width modulation (PWM) method, comprising:
   determining a target duty cycle of a PWM signal;
   determining a number of PWM cycles present in a period of the PWM signal;
   pseudo-randomly selecting a duty cycle for each one of the number of PWM cycles using one of a plurality of look-up tables, wherein the one of the plurality of look-up tables is pseudo-randomly selected; and
   generating the PWM signal based on the duty cycle for the each one of the number of PWM cycles.

2. The method of claim 1, wherein the plurality of look-up tables is used to assign a pulse-width of the each one of the number of PWM cycles.

3. The method of claim 2, wherein each one of the plurality of look-up tables indicates a number of clock pulses present in each one of the PWM cycles for the period of the PWM signal.

4. The method of claim 1, wherein the plurality of look-up tables are interpreted based on a number of clock cycles being added to pulses present in the period of the PWM signal to obtain the target duty cycle.

5. The method of claim 1, wherein the period of the PWM signal is expanded to increase a resolution of the target duty cycle of the PWM signal.

6. The method of claim 1, wherein at least one of the plurality of look-up tables is obtained by mirroring respective ones of the plurality of look-up tables.

7. A system for pseudo-random pulse width modulation (PWM), comprising:
   a first PWM circuit generating a stream of a first PWM signal having an n clock cycle long pulse;
   a second PWM circuit generating a stream of a second PWM signal having an n+a clock cycle long pulse; and
   a PWM signal selection circuit pseudo-randomly selecting between the first PWM signal and the second PWM signal based on a target PWM duty cycle, wherein each of the first PWM signal and the second PWM signal is one PWM cycle long, wherein n and a are positive integers, the PWM signal selection circuit comprising:
      a plurality of multiplexers with each multiplexer generating a candidate signal by selecting between the first PWM signal and the second PWM signal based on a first selection signal;
      a plurality of pseudo-randomly selected look-up table generation logics with each look-up table generation logic generating the first selection signal; and
      an n-to-one multiplexer pseudo-randomly selecting the candidate signal of one of the plurality of multiplexers to generate an output signal.

8. The system of claim 7, wherein the plurality of look-up table generation logics are different from each other.

9. The system of claim 7, wherein the first selection signal is determined based on a number of clock cycles being added to pulses present in a PWM period associated with the output signal.

10. The system of claim 9, wherein a location of the second PWM signal within the PWM period is pseudo-randomly determined.

11. The system of claim 9, further comprising a counter module coupled to the plurality of look-up table generation logics generating an order of PWM cycles present in the PWM period.

12. The system of claim 7, further comprising a pseudo-random selection module coupled to the n-to-1 multiplexer generating a signal which enables the n-to-1 multiplexer to perform the selecting the candidate signal.

13. An apparatus for pseudo-random pulse width modulation, comprising:
   a plurality of multiplexers with each multiplexer generating a candidate signal by selecting between a first PWM signal having an n clock cycle long pulse and a second PWM signal having an n+a clock cycle long pulse based on a first selection signal;
   a plurality of pseudo-randomly selected look-up table generation logics with each look-up table generation logic generating the first selection signal; and
   an n-to-one multiplexer pseudo-randomly selecting the output signal of one of the plurality of multiplexers to generate an output signal, wherein n and a are positive integers.

14. The apparatus of claim 13, wherein a duty cycle of the output signal is n/(total clock cycles in a single cycle of the first PWM signal) or (n+a)/(total clock cycles in the single cycle of the first PWM signal).

15. The apparatus of claim 13, wherein the first PWM signal and the second PWM signal are based on a single PWM cycle.

16. The apparatus of claim 13, wherein the plurality of look-up table generation logics are different from each other.

17. The apparatus of claim 13, wherein the first selection signal is determined based on an order of PWM cycles in a PWM period associated with the output signal and a number of clock cycles to add to pulses present in the PWM period.

18. The apparatus of claim 17, further comprising a counter module coupled to the plurality of look-up table generation logics generating the order of PWM cycles present in the PWM period.

19. The apparatus of claim 13, further comprising a pseudo-random selection module coupled to the n-to-1 multiplexer generating a signal which enables the n-to-1 multiplexer to perform the selecting the candidate signal.

* * * * *